(12) United States Patent
Jiang et al.

(10) Patent No.: US 8,792,169 B2
(45) Date of Patent: Jul. 29, 2014

(54) OPTICAL DIFFRACTION GRATINGS AND METHODS FOR MANUFACTURING SAME

(75) Inventors: Hanqing Jiang, Chandler, AZ (US); Hongbin Yu, Chandler, AZ (US); Cunjiang Yu, Champaign, IL (US); Kevin O'Brien, Menlo Park, CA (US); Yong-Hang Zhang, Scottsdale, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 103 days.

(21) Appl. No.: 13/357,269

(22) Filed: Jan. 24, 2012

(65) Prior Publication Data
US 2012/0212820 A1  Aug. 23, 2012

Related U.S. Application Data

(60) Provisional application No. 61/435,507, filed on Jan. 24, 2011.

(51) Int. Cl.
G02B 5/18 (2006.01)

(52) U.S. Cl.
USPC ............ 359/566; 359/569; 359/570; 359/574

(58) Field of Classification Search
USPC ................. 359/566, 569, 570, 572, 574, 576; 264/230, 220; 427/162, 165–169; 428/152
See application file for complete search history.

(56) References Cited

U.S. PATENT DOCUMENTS

| 2006/0113279 | A1* | 6/2006 | Little | 216/41 |
| 2008/0125510 | A1* | 5/2008 | Crosby et al. | 522/99 |
| 2009/0297776 | A1* | 12/2009 | Crosby et al. | 428/152 |
| 2010/0143677 | A1* | 6/2010 | Lee et al. | 428/212 |

OTHER PUBLICATIONS

Harrison et al. "Sinusoidal Phase Grating Created by a Tunably Buckled Surface," Oct. 1, 2004, Applied Physics Letters vol. 85, pp. 4016-4018.*
Bowden et al. "Spontaneous Formation of Ordered Structures in Thin Films of Metals Supported on an Elastomeric Polymer" May 14, 1998, Nature vol. 393, pp. 146-149) =.*
Ohzono et al. "Geometry-Dependent Stripe Rearrangement Processes Induced by Strain on Preordered Microwrinkle Patterns," Jul. 7, 2005, American Chemical Society, Langmuir vol. 21, pp. 7230-7237.*
Ayras P, et al. (1999) Diffraction gratings in sol-gel films by direct contact printing using a UV-mercury lamp. Opt. Comms 162: 215-218.
Fang Y, et al. (2006) Resonant waveguide grating biosensor for living cell sensing. Biophys. J., 91(5): 1925-1940.
Gudeman CS, et al. (2002) Using the Grating Light Valve device as a multichannel variable optical attenuator (VOA) for the 1.55-um spectral region. Proc. SPIE, 4653: 56-61.
Harris Ak, et al. (1980) Silicone Rubber Substrata: A New Wrinkle in the Study of Cell Locomotion. Science, 208: 177-179.
Huang R, et al. (2005) Kinetic wrinkling of an elastic film on a viscoelastic substrate. J. Mech. Phys. Solids, 53: 63-89.

(Continued)

Primary Examiner — Scott J Sugarman
(74) Attorney, Agent, or Firm — Ballard Spahr LLP

(57) ABSTRACT

Described herein are diffraction gratings and methods for the manufacture thereof. One method comprises applying a force to a substrate to strain the substrate, disposing a thin film on at least a portion of the substrate, and reducing the force applied to the substrate, thereby causing the thin film to buckle.

17 Claims, 13 Drawing Sheets

(56) References Cited

OTHER PUBLICATIONS

Huang ZY, et al. (2005) Nonlinear analysis of srinkles in films on soft elastic substrates. J. Mech. Phys. Solids, ; 53: 2101-2118.

Huck WTS, et al. (2000) Ordering of Spontaneously Formed Buckles on Planar Surfaces. Langmuir, 16: 3497-3501.

Jiang H, et al. (2007) Finite deformation mechanics in buckled thin films on compliant supports. Proc. Natl. Acad. Sci. U.S.A., 104(4): 15607-15612.

Jiang HQ, et al. (2008) Finite width effect of thin films buckling on compliant substrate: experimental and theoretical studies. J. Mech. Phys. Solids, 56: 2585-2598.

Khang DY, et al. (2006) A Stretchable Form of Single-Crystal Silicon for High-Performance Electronics on Rubber Substrates. Science, 311: 208-212.

Lacour SP, et al. (2005) Stretchable Interconnects for Elastic Electronic Surfaces. Proc. IEEE, 93: 1459-1467.

Raguin DH, et al. (1993) Antireflection structured surfaces for the infrared spectral region. Appl. Opt., 332: 1154-1167.

Wong CW, et al. (2003) Analog Tunable Gratings Driven by Thin-Film Piezoelectric Microelectromechanical Actuators.; Appl. Opt., 42: 621-626.

Yasseen AA, et al. (1999) Diffraction grating scanners using polysilicon micromotors. IEEE J. Sel. Top. Quantum Electron., 5: 75-82.

Yu C, et al. (2009) A Stretchable Temperature Sensor Based on Elastically Buckled Thin Film Devices on Elastomeric Substrates. Appl. Phys. Lett., 95: 141912.

Yu C, et al. (2009) Stretchable Supercapacitors Based on Buckled Single-Walled Carbon Nanotube Microfilms. Adv. Mater., 21: 4793-4797.

* cited by examiner

Sample clamping and pre-tension (i)

Oxygen plasma treatment and Au/Pd sputter coating (ii)

Tension releasing (iii)

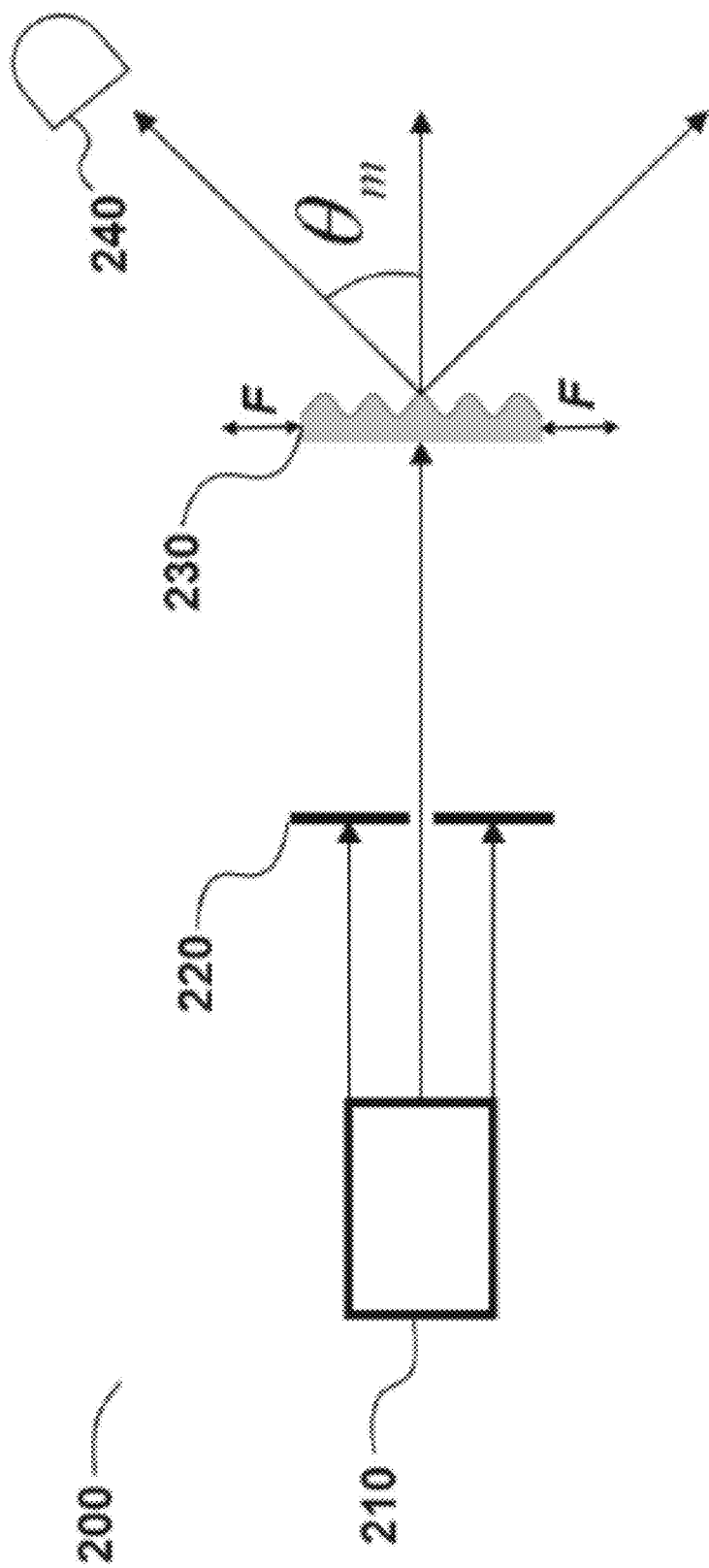

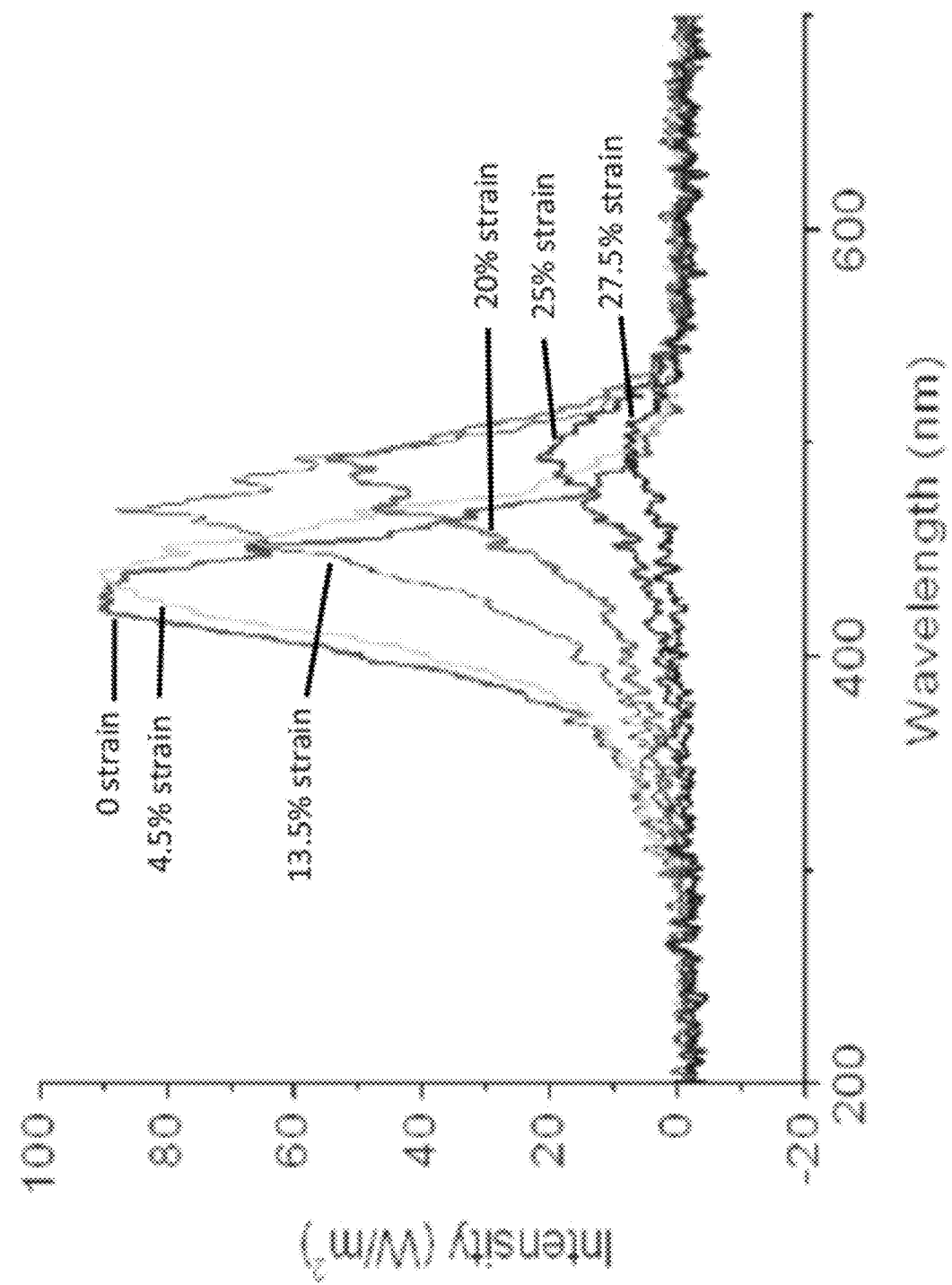

OPTICAL DIFFRACTION GRATINGS AND METHODS FOR MANUFACTURING SAME

CROSS REFERENCE TO RELATED PATENT APPLICATION

This application claims priority to U.S. Provisional Application No. 61/435,507 filed Jan. 24, 2011, herein incorporated by reference in its entirety.

STATEMENT OF GOVERNMENT SUPPORT

This invention was made with United States government support under Grant CMMI0700440 awarded by the National Science Foundation. The government has certain rights in this invention.

TECHNICAL FIELD

The present invention relates to diffraction gratings, and specifically to methods for manufacturing diffraction gratings.

BACKGROUND

Diffraction gratings are utilized in a variety of technologies and can form an integral part of optical or spectral analysis tools in sensing, chemical analysis, and security applications. For example, diffraction gratings can be used as dispersive elements for spectrum analyzers or to select, tune, and expand the light spectrum of laser devices. Diffraction gratings can also be used as optical coupling elements in light and optical communication devices.

Diffraction gratings are typically manufactured by one of two conventional methods. The first method utilizes ruling engines, such as a precision stage equipped with diamond tips to produce mechanically ruled gratings. The properties of a mechanically ruled grating can thus vary based on the specific ruling engine used in its manufacture. In addition, gratings produced by a ruling engine can suffer from, for example, the presence of stray lines that can limit or adversely affect use in high impact spectrometers. A diamond turning process can be very slow, as the ruling diamond may need to travel a long distance to produce a single grating. For example, a square grating (10cm×10 cm) with a groove density of 1,000 grove/mm can require miles of diamond tip travel and take weeks to produce. Thus, the use of a ruling engine to manufacture a diffraction grating can be costly, requiring significant time and strict control of the production environment.

The second method for manufacturing diffraction gratings utilizes laser interference lithography to produce holographic gratings having sinusoidal grooves. In the manufacture of holographic gratings, lasers are used to etch a film coated on a substrate. The resulting etched substrate can have a regular pattern of grooves, which can be bombarded with an ion beam to produce a blazed grating and to enhance the efficiency of the resulting grating. While the laser interference lithography process can be faster than diamond turning techniques, the process can be limited by the laser beam size, which is typically on the order of millimeters. Thus, large gratings can still require significant manufacturing times. The laser interference lithography process be limited with respect to groove frequency. For example, gratings with groove densities less than a few hundred grooves per millimeter can require cumbersome and expensive optical recording systems.

Other recently developed techniques include imprint lithography techniques, where electron beam lithography and photolithography or embossing techniques are used to reproduce fine patterns from a mask onto a substrate. Thus, there is a need for improved manufacturing techniques for diffraction gratings. This and other needs are satisfied by the compositions and methods of the present invention.

SUMMARY

Disclosed herein are diffraction gratings comprising thin film materials positioned on at least a portion of a substrate. Also disclosed are methods for preparing diffraction gratings comprising thin film materials positioned on substrates.

In an aspect, the present disclosure relates to tunable optical gratings and methods of fabricating the optical gratings by causing a thin layer of stiff material that is supported by an elastomeric substrate to buckle. The buckled undulating topography of the disclosed optical gratings functions as the diffraction grating. The optical gratings can be tuned in operation by reversibly changing the grating period or buckled wavelength by mechanical stretch and compression. The disclosed optical gratings allow for the in-plane tuning of the wavelength of transmitted light and could be used in a variety of optical applications.

In an aspect, a method for making an optical grating can comprise applying a force to a substrate to strain the substrate, disposing a thin film on at least a portion of the substrate, and reducing the force applied to the substrate, thereby causing the thin film to buckle.

In an aspect, a method for making an optical grating can comprise providing a strained substrate, disposing a thin film on at least a portion of the strained substrate, and reducing a force applied to the substrate, thereby causing the thin film to buckle.

In an aspect, an optical grating can comprise an elastomeric substrate and a thin film disposed on at least a portion of the substrate, the thin film comprising a metal and having a periodic shape.

The advantages of the invention will be set forth in part in the description which follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

The accompanying drawings, which are incorporated in and constitute a part of this specification, illustrate embodiments and together with the description, serve to explain the principles of the methods and systems:

FIGS. 2C and 2D are SEM images; FIG. 2E is an AFM image;

FIG. 5B shows a drawing of a schematic experimental setup for stretchable diffraction grating measurements;

FIG. 6A shows the measured intensities of the first order diffraction showing the light wavelength shift of 85 nm with a fixed detector;

DETAILED DESCRIPTION

Figure 1A:
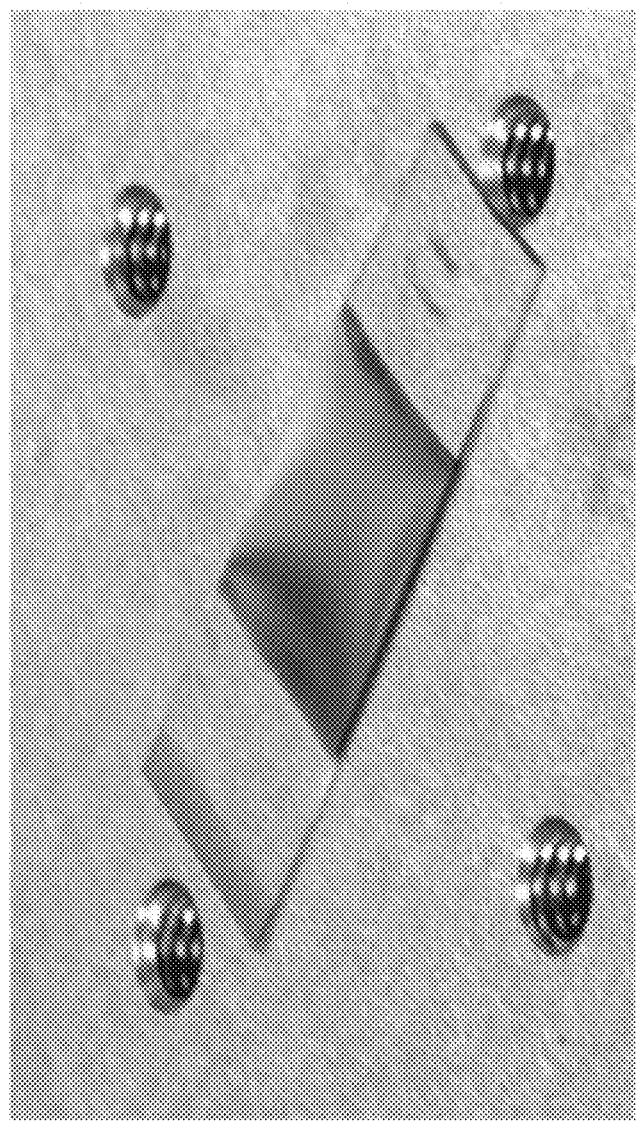
FIG. 1A is a photograph of a periodic optical grating formed from a buckled gold thin film (11 nm thick) on a PDMS substrate, prepared in accordance with various aspects of the present disclosure.

Before the present compounds, compositions, composites, articles, devices and/or methods are disclosed and described, it is to be understood that the aspects described below are not limited to specific compounds, compositions, composites, articles, devices, methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a layer" includes of two or more such layers, and the like.

"Optional" or "optionally" means that the subsequently described event or circumstance can or cannot occur, and that the description includes instances where the event or circumstance occurs and instances where it does not.

Ranges may be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Disclosed are compounds, compositions, and components that can be used for, can be used in conjunction with, can be used in preparation for, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. For example, if a number of different elastomers and stiff materials are disclosed and discussed, each and every combination and permutation of the elastomer and stiff material are specifically contemplated unless specifically indicated to the contrary. Thus, if a class of elastomers A, B, and C are disclosed as well as a class of stiff materials D, E, and F and an example of a combination elastomer-stiff material, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed optical gratings. Thus, if there are a variety of additional steps that can be performed it is understood that each of these additional steps can be performed with any specific embodiment or combination of embodiments of the disclosed methods, and that each such combination is specifically contemplated and should be considered disclosed.

Ruled vs. Holographic gratings

In one aspect, gratings fabricated through the buckled film methods described herein can have sinusoidal profiles. In such an aspect, the resulting gratings can be suitable for use as holographic gratings. Ruled gratings have frequently been used in laboratory spectrometers due to their efficiency at the blazed wavelength, but the efficiency can be significantly less over other wavelength ranges. This property can make the use of ruled gratings challenging without detailed calibration data.

Holographic gratings, on the other hand, need not have straight grooves. Groove curvature can be modified to reduce aberrations in the spectrum, thereby improving the throughput and spectral resolution of imaging spectrometers. A common spectrometer mount is the flat-field spectrograph, in which the spectrum is imaged onto a flat detector array and several wavelengths are monitored simultaneously. Holographic gratings can improve the imaging of such a grating system, whereas classical ruled gratings are not suitable for forming well-focused planar spectra without auxiliary optics.

Buckled Thin Film Gratings

As briefly described above, optical gratings can form an integral part of many optical spectral analysis tools that can be useful in sensing, chemical analysis and security applications. Conventional manufacturing methods for diffraction gratings rely on precision machining, such as diamond turning, or laser lithographic tools, which can be prohibitively expensive. In one aspect, the present disclosure provides methods to prepare diffraction gratings using buckled thin films on elastomeric substrates. In one aspect, the inventive methods can significantly reduce the manufacturing cost of diffraction gratings and/or greatly improve the manufacturing efficiency while maintaining high quality.

In one aspect, the inventive methods comprise the use of thin metal films deposited on pre-strained elastomeric substrates. In another aspect, the thin metal films can have a thickness in the range of tens of nanometers, for example, from about 5 to about 200 nm. In another aspect, relaxation of the pre-strained substrate, after deposition of the thin metal film, will result in buckling of the metal film to a sinusoidal shape.

In one aspect, the periodicity of the grating, ranging from hundreds of nm to tens of μm, can be easily controlled through the variation of the thickness of the deposited thin films and pre-strain applied on the elastomeric substrates.

The substrate of the present invention can comprise any suitable substrate material. In one aspect, a substrate can comprise a polymeric material. In another aspect, a substrate can be strained and/or stretched. In a specific aspect, a substrate can comprise PDMS. In other aspects, a substrate can comprise one or more individual layers, wherein each layer can comprise a same or different composition. In another aspect, a substrate can be optically transparent or substantially optically transparent to radiation of interest. In still other aspects, the geometry of a substrate can vary depending upon the intended application.

The thin film of the present invention can comprise any thin film material suitable for use in a diffraction grating. In one aspect, the thin film comprises one or more metals, such as, for example, Au, Ag, Pt, or Pd. In other aspects, the thin film can comprise other metals or components not specifically recited herein, and the present invention is not intended to be limited to any particular thin film composition. In various aspects, the thickness of the thin film can vary, depending upon, for example, the wavelength range of interest and/or the thin film composition. In one aspect, the thickness of a thin film be from about 1 nm to about 500 nm, for example, about 1, 2, 4, 5, 7, 9, 10, 12, 14, 16, 18, 20, 24, 28, 32, 36, 40, 50, 60, 70, 90, 100, 125, 150, 200, 250, 300, 400, or 500 nm. In other aspects, the thickness of a thin film can be less than about 1 nm or greater than about 500 nm, and the present invention is not intended to be limited to any particular film thickness.

The thin film of the present invention can be applied using any suitable deposition technique. In various aspects, a thin film can be deposited using a thermal evaporation technique, a sputtering technique, or a combination thereof. In other aspects, a thin film can be deposited using other techniques not recited herein. In one aspect, a substrate is subjected to a strain condition by, for example, stretching, prior to deposition of the thin film. In another aspect, the thin film is deposited while the substrate is strained and/or stretched. In various aspects, an applied strain can result in stretching of the substrate in at least direction in an amount of from about 1% to about 400%, for example, about 1, 2, 4, 6, 8, 10, 20, 40, 60, 80, 100, 120, 140, 160, 180, 200, 225, 250, 275, 300, 325, 350, 375, or 400%. In other aspects, an applied strain can results in stretching of the substrate in at least one direction of less than about 1% or greater than about 400%.

In one aspect, the thin film can be deposited as a continuous layer on at least a portion of the substrate. In another aspect, the thin film can be deposited in a pattern or in one or more discrete locations on a substrate. In such an aspect, the pattern of a deposited film can be designed so as to minimize and/or prevent cracking of the deposited film. One of skill in the art, in possession of this disclosure could readily select an appropriate substrate, thin film, and/or deposition technique.

After deposition of the thin film onto the substrate, the strain and/or stretching force on the substrate can be removed and/or reduced. In one aspect, the reduction and/or removal of strain/stretching force from the thin film coated substrate can result in buckling of the thin film. In various aspects, such a buckled thin film can act as a diffraction grating.

The inventive methods provide the opportunity to efficiently produce diffraction gratings for new and emerging applications, such as, for example, hyperspectral sensing, at relatively low cost. In hyperspectral sensing, the dispersion of electromagnetic waves in the broad spectrum range in the infrared (IR), including Short-Wave IR (SWIR), Mid-Wave IR (MWIR) and Long-Wave IR (LWIR), make existing laser interference lithography techniques cumbersome and expensive to implement. Similarly, diamond turning techniques are expensive and slow. Thus, in one aspect, the inventive methods provided herein can significantly advance remote sensing, biochemical analysis, and security applications using the resulting diffraction gratings.

In further details, hyperspectral sensing is an optical spectral analysis technique that has been adopted to monitor the planetary and agriculture distribution. The technique relies on the dispersion of incoming light into different wavelength ranges, typically using gratings. The difference between hyperspectral analysis and traditional optical spectroscopy used in the laboratory setting is the spectral coverage. In a normal spectrometer, the wavelength range spans from 400 nm to 800 nm, while for hyperspectral sensing the wavelength range spans from 400 nm to 2,500 nm, and more desirably from 3 μm to 5 μm due to the spectroscopy signature of many molecules and crystals residing in these ranges. Therefore, the capability of a hyperspectral sensor depends on the performance of the grating, as well as the ability to manufacture gratings in a cost-effective way with large throughput.

In one aspect, the inventive methods provide advantages over conventional grating manufacturing processes. In one aspect, the inventive methods are simpler than conventional methods, involving only a mechanical straining process, an oxygen plasma treatment step, and a routine metal deposition step. In another aspect, the inventive methods can be performed at significantly lower cost than conventional methods because of the simplicity of the fabrication steps. In another aspect, the inventive methods can provide high throughput as compared to conventional manufacturing methods. In such an aspect, the inventive methods can provide a parallel process and can be conveniently extended to a grating of many inches is size, in a single fabrication process cycle. In yet another aspect, the inventive methods can produce gratings that can cover a large spectral range, such as, for example, from visible to long-wave IR of over 15 μm. In one aspect, the only difference required for use at differing wavelengths is that the deposited metal film can be thicker (e.g., in the hundreds of nanometer range) for low groove density gratings intended for IR operation.

In yet another aspect, the inventive methods can be easily adapted to concave surfaces preferred in some spectroscopy applications. In such an aspect, the substrate material can be elastomeric and can conform to various shapes. In yet another aspect, diffraction gratings produced by the inventive methods can exhibit high quality in grove periodicity precision and grating diffraction efficiency. In contrast to diamond turning and laser interferometric lithography techniques, where nanometer structure accuracy is achieved through lateral precision mechanical motion or through precision optical systems, nanometer precision in the inventive techniques can be achieved through control of the thickness and uniformity of the deposited film. FIG. 1A depicts an inventive diffraction grating prepared from the buckled thin film techniques described herein. As an example, the diffraction grating can be periodic optical grating formed from buckled gold thin film (e.g., about 11 nm thick) disposed on poly(dimethylsiloxane) (PDMS) substrate.

Figure 1B:
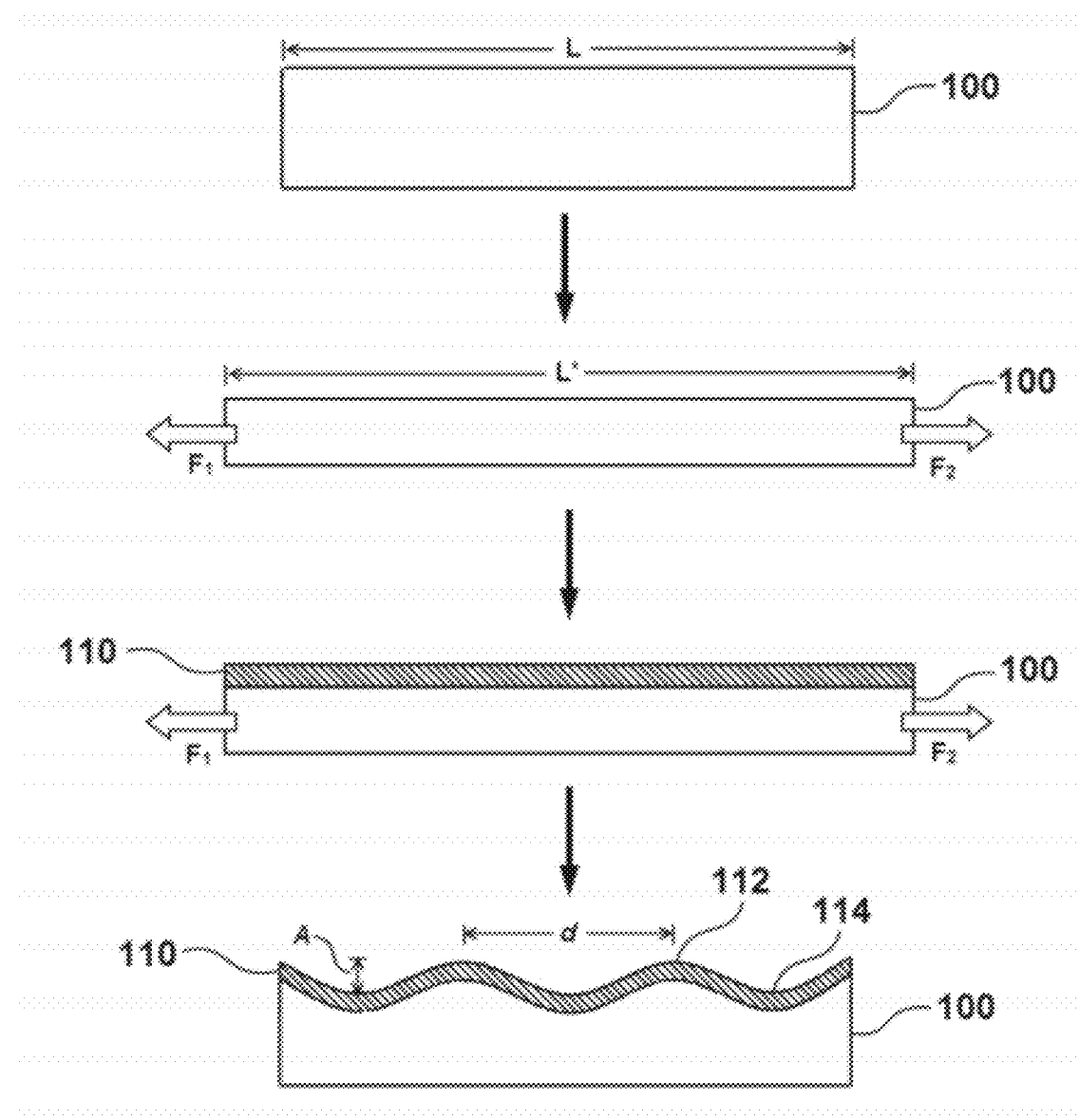
FIG. 1B is a cross-sectional view of the optical gratings of the disclosure and a schematic illustration of process for making the gratings.

With reference to FIG. 1B, the optical grating of the invention is prepared from an elastomeric substrate 100 having an unstrained length "L" and a suitable elastic modulus. Opposed uniaxial stretching forces, F1 and F2, are applied to the elastomeric substrate 100 to strain the elastomeric substrate 100 to a strained length L'. A stiff material is then applied to the surface of the strained elastomeric substrate 100 to form a layer of stiff material 110 on the surface of the strained elastomeric substrate 100. During the application of the stiff material 110 to elastomeric substrate 100, the strain on the elastomeric substrate 100 is maintained. Following the formation of the layer of stiff material 110, F1 and F2 are at least decreased in magnitude and preferably removed from the elastomeric substrate 100, such that the elastomeric substrate 100 with the layer of stiff material 110 relaxes back to substantially the same as, or the same as, its original length L.

The reduction/removal of F1 and F2 and the relaxation of the elastomeric substrate 100 causes the layer of stiff material 110 to buckle, thereby creating an undulating surface having a series of substantially parallel ridges 112 and valleys 114. The undulating surface can be characterized by the amplitude (A) and the period or wavelength (d), which is the distance between ridges.

The elastomeric substrate 100 can comprise a variety of types of elastomers, as long as the substrates are able to bond with the applied layer of stiff material 110, preferably even when the layer of stiff material 110 is of nanometer thickness. Preferred examples of elastomeric materials include without limitation silicone rubbers, for example PDMS.

A variety of stiff materials can be used in layer 110. Suitable materials include a variety of metallic materials, such as platinum, aluminum, gold, silver, nickel, indium-tin-oxide (ITO), or a combination thereof. A preferred stiff material for use with layer 110 is a combination of platinum and gold, for example about 5% platinum and 95% gold. Other materials can combinations can be used.

The thickness of layer 110 is preferably thin enough to maintain the transparency of the substrate. In one aspect, layer 110 has a thickness of up to about 30 nm, preferably up to about 20 nm, and more preferably up to about 15 nm. A suitable minimum thickness for layer 110 is about 3 nm, preferably about 5 nm. Other thicknesses can be used.

The length L of the elastomeric substrate 100 will be strained to a length L'. Depending on the elastomeric material, L' can be as much as 200% greater than L or more.

The relationship between L and L' depends on the amount of force F1 and F2 applied and can be determined based on the above equations, depending on the desired buckling amplitude and period of the optical grating. In a specific aspect, L is strained to a length L' that is from about 10% to about 50% greater than L.

In various aspects, advantages of the inventive manufacturing techniques are summarized in Table I, below.

TABLE I

Comparison of Buckled Thin Films Technique with Other Grating Manufacturing Techniques

| Performance | Diamond Turning | Laser Interference | Buckled Thin Film |
|---|---|---|---|
| holographic or ruled | ruled | holographic | holographic |
| cost | high | high for low groove density | very low |
| manufacturing efficiency | low | low | very high |

TABLE I-continued

Comparison of Buckled Thin Films Technique with Other Grating Manufacturing Techniques

| Performance | Diamond Turning | Laser Interference | Buckled Thin Film |
|---|---|---|---|
| size | cm possible | limited | large |
| adaptable to curved surface | possible, but difficult | difficult | very easy |
| wavelength range | visible to LWIR | visible to SWIR | visible to LWIR |
| precision | nm | tens of nm | nm |

Fabrication of Grating Structure Based on Buckled Thin Film

In various aspects, ordered buckling structures in thin films on elastomeric substrates (e.g., poly(dimethylsiloxane) (PDMS)), can have broad applications ranging from stretchable electronic interconnects and stretchable electronic devices, microelectromechanical systems (MEMS) and nanoelectromechanical systems (NEMS) and tunable diffraction and phase gratings, to force spectroscopy in cells, biocompatible topographic matrices for cell alignment, modern metrology methods, and methods for micro/nano-fabrication.

In other aspects, thin buckled films on elastomeric supports can be prepared in varying geometries. In one aspect, thin metal films can be deposited onto a pre-strained elastomer. In such an aspect, sinusoidal wave patterns and a network of micro/nanocracks can be formed in the metal. In another aspect, solid films or ribbons created on a separate growth substrate can be transferred onto a pre-strained elastomer in a manner that yields well controlled sinusoidal geometries. In both of these aspects, thermal and/or mechanical methods can be used to strain the elastomeric substrate, prior to deposition or transfer such that relaxing the pre-strain in the substrate yields a compressive strain and buckling in the film. In one aspect, the buckling at least partially releases the compressive strain in the deposited film.

In one aspect, a broad range of materials can be utilized for the methods of the present invention, including even brittle single crystalline semiconductors such as silicon and gallium arsenide, without cracking. In another aspect, these geometric configurations can involve strong bonding of the films to the substrates at multiple or all points along their interface.

Figure 2A:
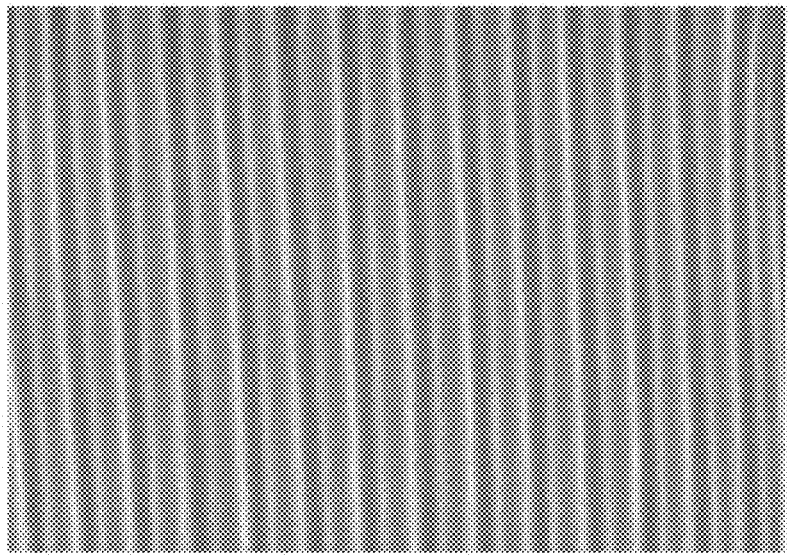
FIGS. 2A-2B illustrate buckled thin films on a PDMS substrate, prepared in accordance with various aspects of the present disclosure.
Figure 2B:
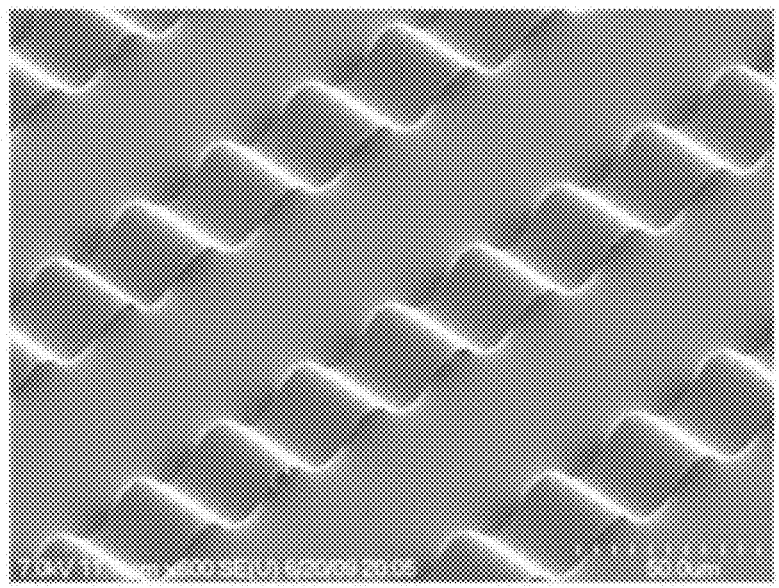

FIGS. 2A-2B illustrate scanning electron microscope (SEM) images of deposited gold and palladium (Au/Pd) thin films on a PDMS substrate (FIG. 2A), and transferred silicon (Si) nanoribbons on PDMS substrates (FIG. 2B), respectively.

Figure 2C:
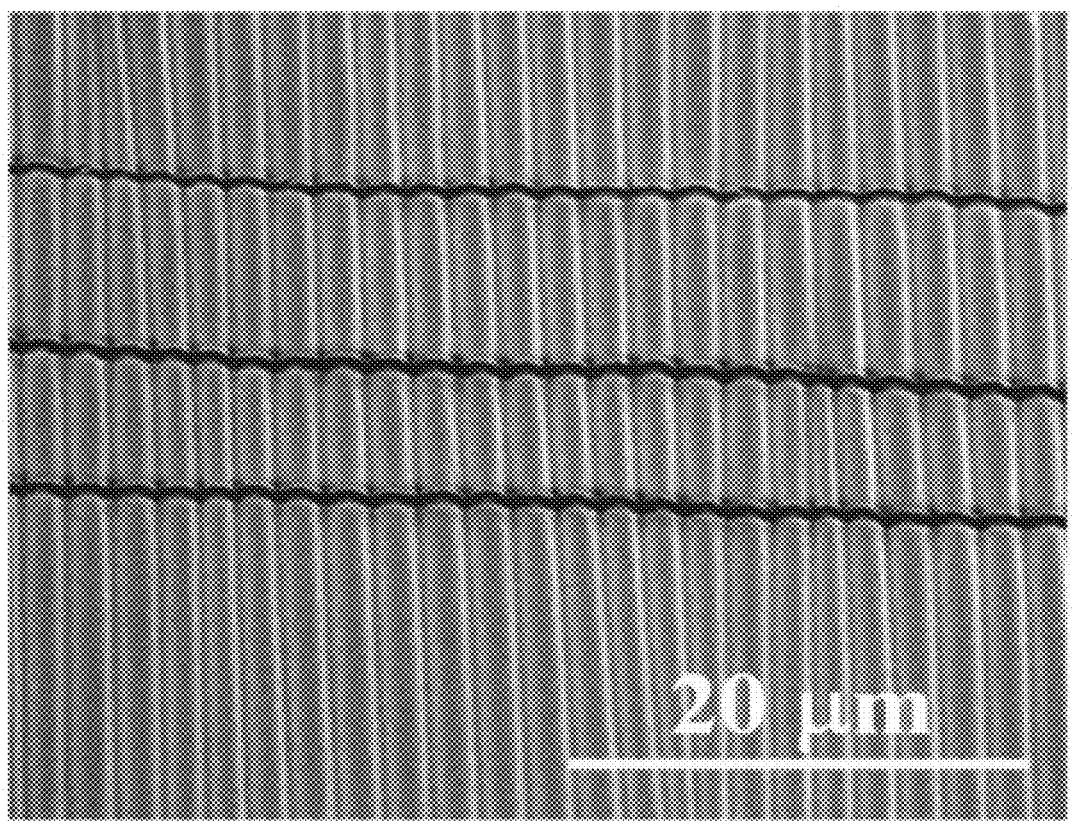
FIG. 2C-2E shows the buckling profile of exemplary Au/Pd thin films on PDMS substrates.
Figure 2D:
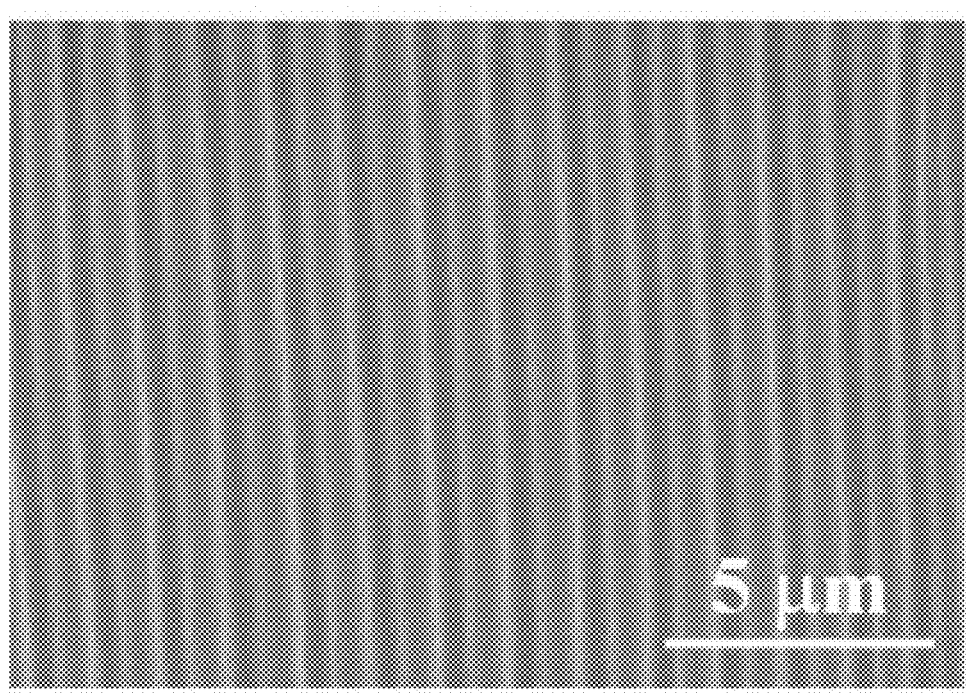
Figure 2E:
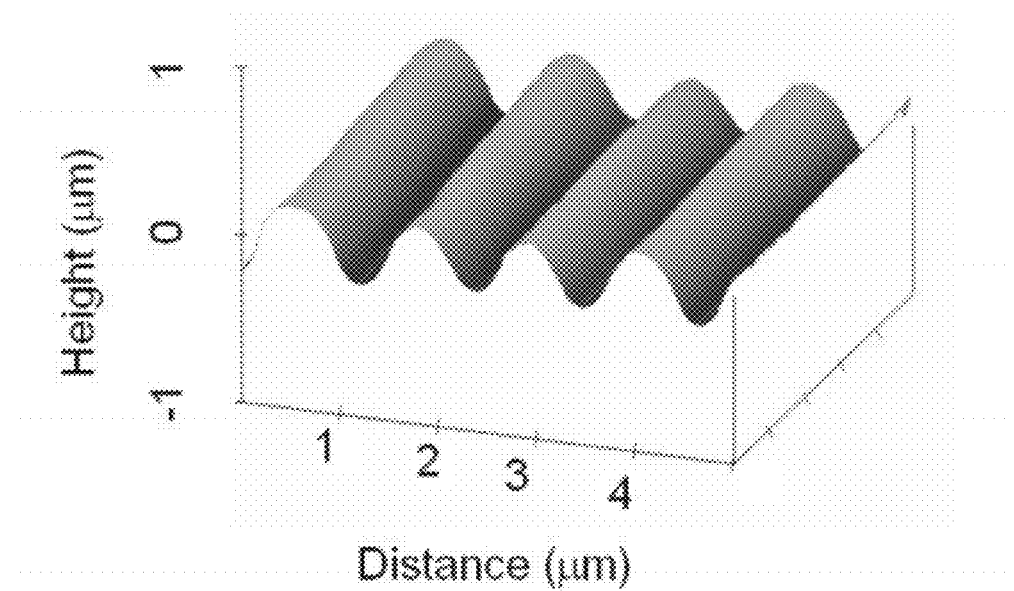

As a specific example, FIG. 2C shows the tilted scanning electron microscope (SEM) image of the periodically buckled Au/Pd film on a PDMS substrate. FIG. 2D shows an enlarged image of the buckled profile, for a 30% pre-strain. The cracks along the pre-strain directions in the Au/Pd film (FIG. 2C) are caused by the lateral tensile deformation of the PDMS during the relaxation process due to the Poisson effect. FIG. 2E is a tapping mode atomic force microscope (AFM) image of the buckled thin films. The wavelength d and amplitude A are 1.21 μm and 0.19 μm, respectively. These values agree well with the analytical analysis (Equations. 1 and 2 below) if the following material parameters are used, $E_f$=80 GPa, $E_s$=2 MPa, $h_f$=11 nm, $v_f$=0.3, $v_s$=0.49.

In one aspect, mechanical models have been developed to understand the inventive buckled film systems. In some applications, such as, for example, modern metrology methods, the measured buckling period can be used to determine the modulus of the thin film or substrate. In such an aspect, the buckling period and/or amplitude can be important for flexible and stretchable electronics since they are closely related to the achievable maximum stretchability.

While not wishing to be bound by theory, a non-linear buckling theory, based on finite deformation for both thin films and elastomeric substrates, has been developed to predict the buckling profile. In one aspect, the thin film can be modeled as a linear elastic material on a semi-infinite compliant substrate subject to large deformation, $$d = \frac{d_0}{(1+\varepsilon_{pre})(1+\xi)^{\frac{1}{3}}}, A \approx \frac{A_0}{\sqrt{1+\varepsilon_{pre}}\,(1+\xi)^{\frac{1}{3}}}, \quad (1)$$

wherein $$d_0 = 2\pi h_f \left[\frac{E_f(1-v_s^2)}{3E_s(1-v_f^2)}\right]^{\frac{1}{3}} \text{ and } A_0 = h\sqrt{\frac{\varepsilon_{pre}}{\varepsilon_c} - 1}$$

are the buckling period and amplitude, respectively, based on small deformation theory, wherein $$\varepsilon_c = \frac{1}{4}\left[\frac{3E_s(1-v_f^2)}{E_f(1-v_s^2)}\right]^{\frac{2}{3}}$$

is defined as the critical buckling strain or the minimum strain needed to induce buckling; and wherein $$\xi = \frac{5}{32}\varepsilon_{pre}(1+\varepsilon_{pre})$$

represents the large deformation and geometrical nonlinearity in the substrate (E is the Young's modulus; n is the Poisson's ratio, and the subscripts "f" and "s" refer to thin films and substrates, respectively). In one aspect, the theoretical model as illustrated in Equation (1), above, agrees with experimental data.

Figure 3:
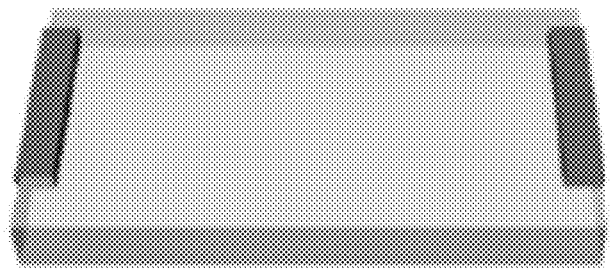
FIG. 3 illustrates the fabrication process for a diffraction grating, in accordance with various aspects of the present disclosure.
Figure 3:
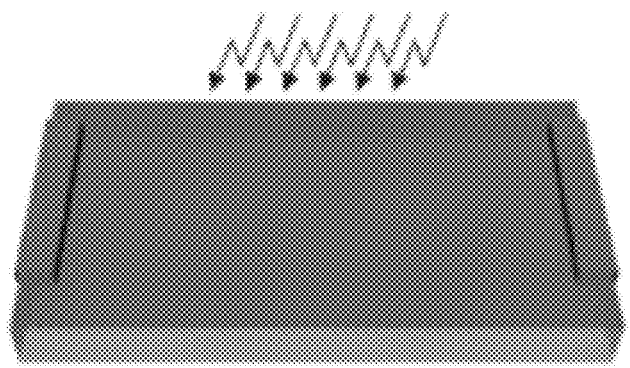
Figure 3:
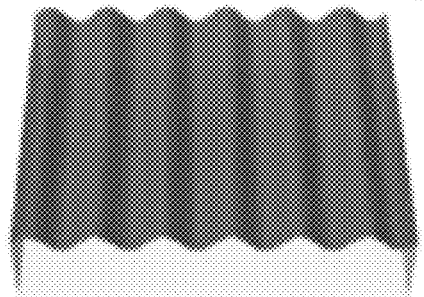

In one aspect, thin films comprising metallic or crystalline materials ($E_f$ is on the order of 100 GPa) on elastomeric substrates such as PDMS ($E_s$ is about 1 MPa) can result in a buckling period d of about two orders higher than the thickness of thin film $h_f$, with reasonable choice of pre-strain. In such an aspect, the thin film thickness should be two orders smaller (i.e., $h_f$ on the order of 10 nm), to generate wrinkle patterns with a submicron period (d~1 mm). Such a process is illustrated in FIG. 3.

In one aspect, a transparent PDMS substrate can be prepared by casting a mixture of base and curing agent at the ratio of, for example, 10:1 by weight, cured and cut to desired sizes. In such an aspect, a 1 mm-thick PDMS strip (10 mm by 40 mm) can be subjected to oxygen plasma treatment (50 Watt, 1 min) and then be pre-stretched, for example, by a custom made stage, at a desired amount of pre-strain. In one aspect, an ultra-thin Au/Pd (95%/5%) film, for example, about 11 nm-thick, can then be sputtered onto the pre-stretched PDMS substrate. In one aspect, the relaxation of the pre-strain in the PDMS compresses the Au/Pd thin film and leads to thin films buckle in a periodic shape with buckling period in the micron range. From images of scanning electron microscope (SEM) and atomic force microscope (AFM), the buckling period d and amplitude A are measured as 1.21 mm and 0.19 mm, respectively. These values agree well with the analytical analysis (Eq. 1) if the following material parameters are used, $E_f$=80 GPa, $E_s$=2 MPa, $h_f$=11 nm, $n_f$=0.3, $n_s$=0.49. Therefore, the micron-range buckling period and amplitude can be accurately described by Equation (1).

In one aspect, the buckling profile can be adjusted by applying a mechanical strain $\varepsilon_{applied}$, such that the buckling period and amplitude change accordingly $$d = \frac{3\pi h_f(1+\varepsilon_{applied})}{(1+\varepsilon_{pre})(1+\varepsilon_{applie}+\zeta)^{\frac{1}{3}}}\left[\frac{E_f(1-v_s^2)}{3E_s(1-v_f^2)}\right]^{\frac{1}{3}}, \quad (2)$$

$$A = h\frac{\sqrt{(\varepsilon_{pre}-\varepsilon_{applied})/\varepsilon_c - 1}}{\sqrt{(1+\varepsilon_{pre})}\,(1+\varepsilon_{applied}+\zeta)^{\frac{1}{3}}}, \quad (3)$$

where $\zeta = 5(\varepsilon_{pre}-\varepsilon_{applied})(1+\varepsilon_{pre})/32$.

In one aspect, and while not wishing to be bound by theory, the buckling period can be predominately determined by the modulus ratio between the elastomeric substrate and the thin film ($E_f/E_s$), the pre-strain ($\varepsilon_{pre}$) and applied strain ($\varepsilon_{applied}$) on the substrate, as well as the thickness of the thin film $h_f$.

In another aspect, the methods of the present invention can provide a periodic buckling pattern and theoretical predictability of the buckling profile, making the resulting structures ideal for use as optical grating. In another aspect, the advantages of the inventive buckling methods can be realized in the wide range of buckling periods that can be produced, from sub-micron to tens of microns. Another advantage of using buckled thin films, such as, for example, Au/PD thin films, on a PDMS substrate is the transparence of PDMS to visible light.

Referring back to FIG. 1B, to generate an undulating surface with a submicron period (d~1 µm), the thickness of the layer of stiff material 110 should be about two orders smaller, i.e., hf is on the order of 10 nm, which can be achieved by the following procedure. A suitable elastomeric substrate 100 can be pre-treated as desired, for example through oxygen plasma treatment and then pre-stretched by a custom made stage at desired pre-strain level.

An ultra-thin layer of stiff material 110 can be applied (e.g., deposited, vacuum coated, sputtered, etc.) onto the pre-stretched substrate 100. The relaxation of the pre-strain in the substrate 100 compresses the layer of stiff material 110 and creates an undulating surface having a buckling wavelength in the micron range.

Reflection vs. Transmission Gratings:

In one aspect, a buckled thin film grating, such as can be produced from the methods of the present invention, can be used as either a transmission or reflection grating. For operation in the short wavelength range where a deposited film is on the order of 10 nm thick, the resulting grating can remain thin enough to allow majority of light to be transmitted. In another aspect, use of a diffraction grating in transmission mode can be advantageous as the detector can be placed directly behind the diffraction grating, enabling a compact spectrometer design by reducing the number of optical components.

In another aspect, a diffraction grating, such as produced by the methods of the present invention, can be utilized in a reflective mode. In such an aspect, thicker films, for example, in the range of 100 nm or larger, can be used to create a longer period on the grating. In an exemplary aspect, a 100 nm thick film can block the majority of light incident on a grating structure. Most gratings used in spectrometers are utilized in a reflection mode. Thus, in one aspect, a buckled thin film grating can be suitable for use in applications in multiple IR ranges, including SWIR, MWIR and LWIR.

Figure 8:
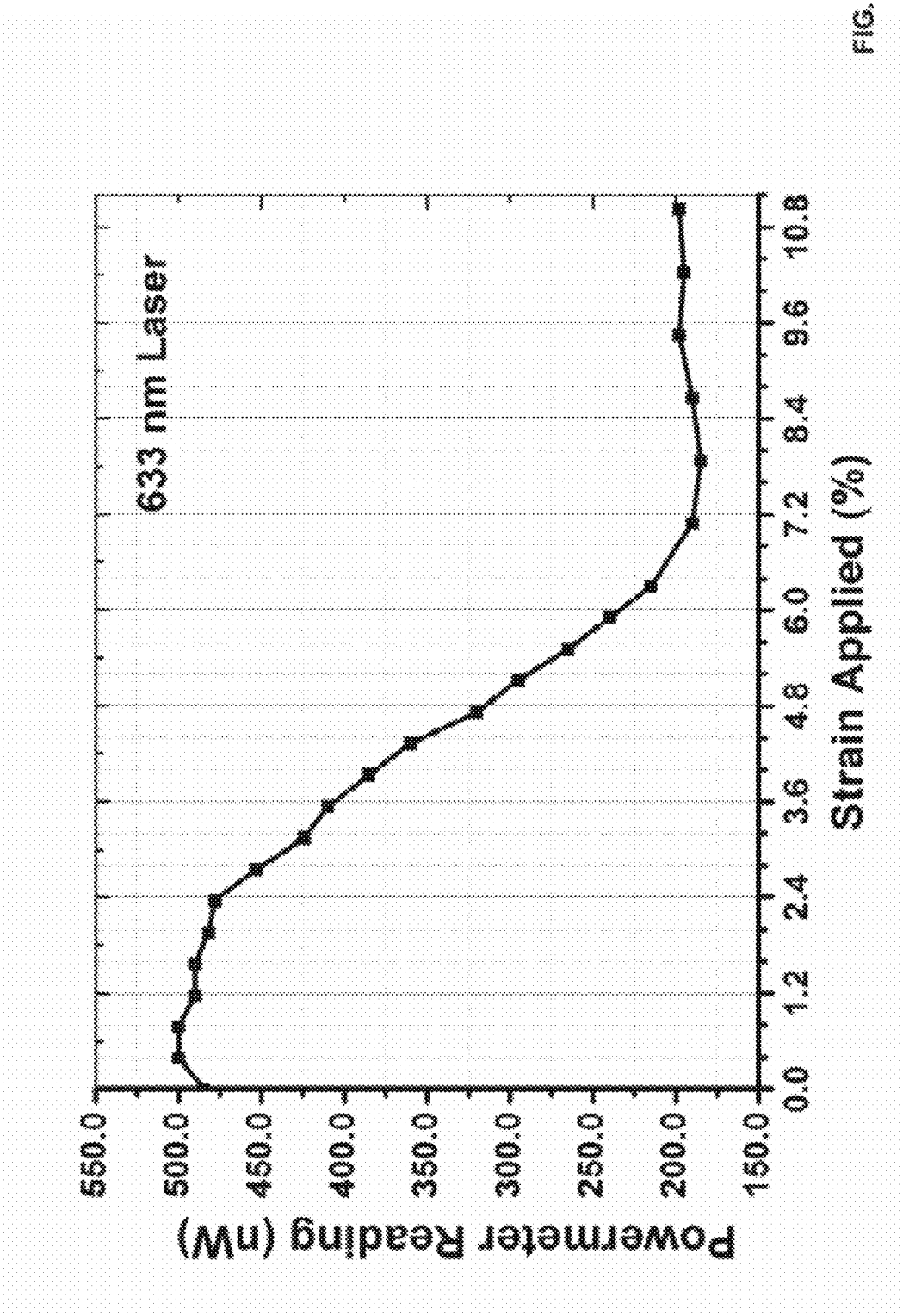
FIG. 8 illustrates a plot of reflection geometry data showing power meter reading vs. strain applied.

As an example, when the deposited film thickness is between 10 nm-100 nm, both reflective and transmission mode gratings can be produced. As illustrated in FIG. 8, a 633 nm laser is diffracted in the reflection geometry by the grating. In an aspect, a range of strain, from below 1%, to 10%, can be measured against a power meter reading (e.g., nW).

Wavelength Range

In various aspects, the methods of the present invention can produce diffraction gratings that can operate (i.e., diffract incident radiation) over a wide variety of spectral ranges, for example, from visible to SWIR (400-2500 nm), MWIR (3-5 μm) and LWIR (10-14 μm). In another aspect, the spectral range over which a buckled thin film grating can be used can be adjusted by changing the thickness of the deposited film while maintaining the same pre-strain condition. For example, a 30% pre-strain condition and an 11 nm thick film can provide a grating having groove pitch of 1.2 μm. For a similar system using a 150 nm thick film, the resulting groove pitch is about 15-μm, sufficient for long-wavelength applications.

Grating Diffraction Efficiency

One important characteristics of a grating is its diffraction efficiency and its variation with wavelength. In one aspect, the efficiency of a grating can be calculated based on the grating's geometry and coatings. The efficiency curves of ruled and holographic gratings generally differ considerably as a result of the differences in groove profiles. A conventional ruled grating can achieve high efficiency at the blazed frequency; while holographic gratings can have a flatter efficiency throughout the spectral range. For a reflection grating, diffraction efficiency can be defined as the energy flow (power) of monochromatic light diffracted into the order being measured, relative to the energy flow of incident light. High efficiency gratings are desirable for several reasons. In one aspect, high efficiency gratings can be advantageous in measuring weak transition lines in optical spectra. A high efficiency grating can also allow the reflectivity and transmission specifications for other components in the spectrometer to be relaxed. Moreover, higher diffracted energy can result in lower instrumental stray light, as the total energy flow for a given wavelength leaving the grating is conserved (being equal to the energy flow incident on it minus any scattering and absorption).

Figure 4:
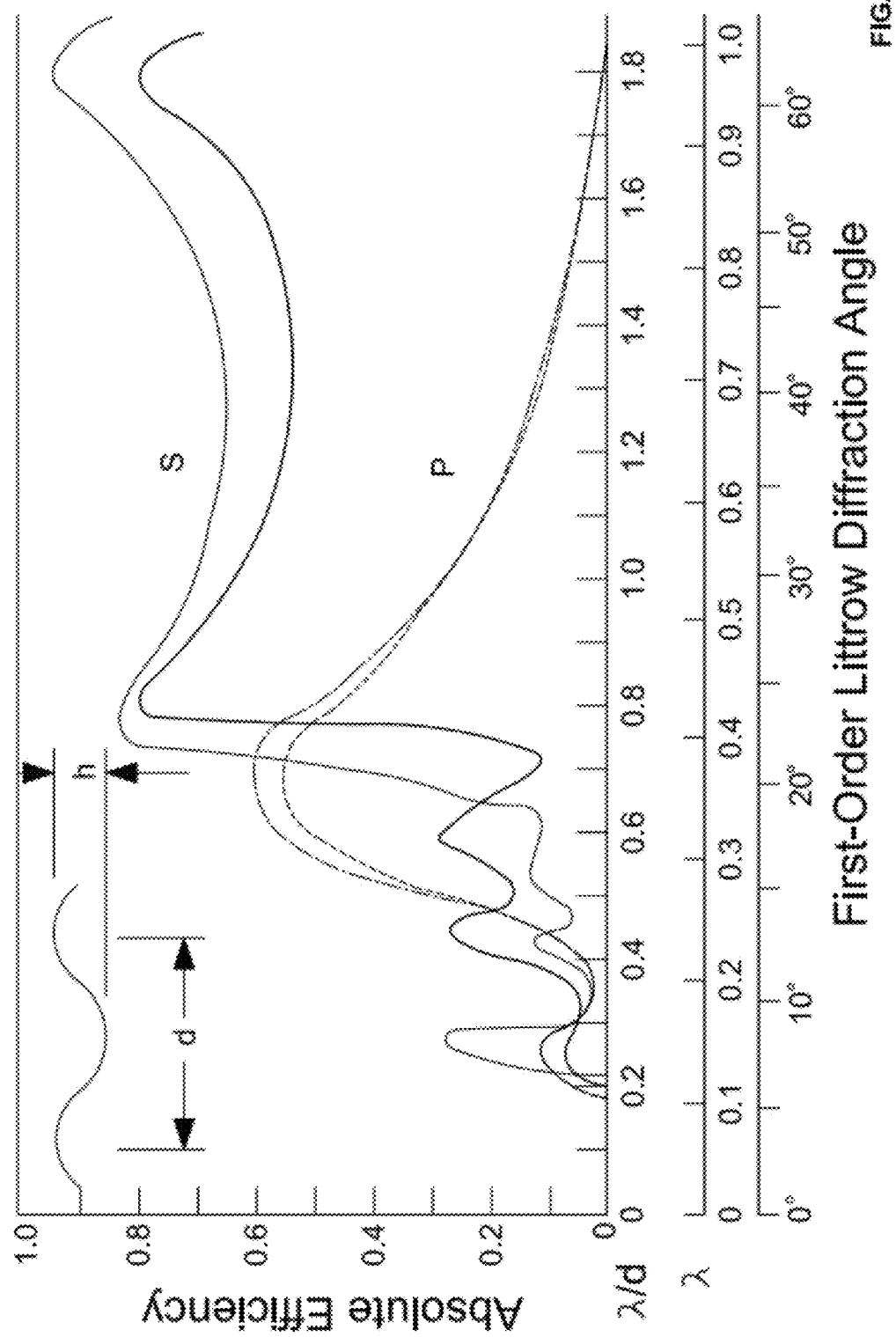
FIG. 4 illustrates the first order theoretical efficiency curve of a sinusoidal grating with an aluminum coating having 1,800 grooves per millimeter ($\mu=0.14$ and Littrow mounting; solid curve—S-plane; dashed curves—P plane)

For holographic gratings, it is convenient to consider different ranges of sinusoidal-groove gratings, with progressively increasing modulation μ, where μ=h/d, with h being the groove height and d the groove spacing. For such a grating, a higher μ value results in higher efficiency. A representative diffraction efficiency curve is illustrated in FIG. 4. As illustrated in FIG. 4, a modulation of 14% can provide a high diffraction efficiency, reaching up to about 80% for S wave.

In one aspect, for buckled thin film gratings, modulation amplitude μ can be easily adjusted through the film thickness variation and/or pre-strain. As described above, the sinusoids can have d=1.2 μm, and h=0.19 μm, resulting in a μ value of 0.16, comparable to the value calculated in FIG. 4. In another aspect, the modulation can be further enhanced by maintaining the same film thickness and increasing the pre-strain from 27% to even higher ratio, for example, 40%. For example, it has been demonstrated that up to 100% strain can be applied to PDMS substrate without it undergoing inelastic change.

Low Scattering Compared to Ruled Gratings

Since holographic gratings do not involve burnishing grooves into a thin layer of metal, surface irregularities on the grooves differ from those of mechanically ruled gratings. Moreover, errors of ruling, which are a manifestation of the fact that ruled gratings have one groove formed after another, are nonexistent in interferometric gratings, where all grooves are formed simultaneously. Holographic gratings, if properly made, can be entirely free of both small periodic and random groove placement errors found on even the best mechanically ruled gratings. Holographic gratings can offer advantages to spectroscopic systems in which light scattered from the grating surface is performance-limiting, such as in the study of the Raman spectra of solid samples, though proper instrumental design is essential to ensure that the performance of the optical system is not limited by other sources of stray light.

Resolution

For a specified focal plane array (FPA) detector, with a size of 40 μm pitch in a 256×256 array, the detector occupies an area of 10 mm×10 mm. When projecting light having a wavelength range of from 400 nm to 2,500 nm onto the from the grating, each detector pixel will cover 10 nm, therefore, the resolution of 10 nm from the dispersion from the grating can achieved. In one aspect, a buckled thin film grating can simultaneously cover the MWIR/LWIR (3-5 μm and 8-14 μm) range. In such an aspect, a grating would need to have a low groove density, or large pitch in the groove greater than 15 μm, requiring thicker metal thin films in the range of 150 nm.

For such a wavelength range, laser interferometric lithography can be challenging, as typical commercial lasers are in the visible spectrum range, from 400-700 nm.

In one aspect, the composition of the thin film can comprise one or more softer materials, such as Au and/or Ag films mixed with, for example, an organic epoxy.

Temperature Dependence:

In one aspect, the substrate, such as, for example, PDMS, can exhibit a temperature stability over an operating temperature range of, for example, from about −45° C. to about 200° C. In another aspect, a substrate can have a coefficient of thermal expansion of about $3.25 \times 10^{-4}/°$ C. For example, when the temperature changes from −20° C. to 50° C., the linear expansion of PDMS is 2.275%. The resulting thermal-induced strain will be applied on the buckled thin film as applied strain $\epsilon_{applied}$. In another exemplary aspect, from Equation (2), if the following material parameters $E_f$=80 GPa, $E_s$=2 MPa, $h_f$=11 nm, $n_f$=0.3, $n_s$=0.49, and pre-strain $\epsilon_{pre}$=30% are used, the buckling period and amplitude change from 1.16 mm to 1.18 mm, and 0.23 mm to 0.22 mm, respectively. More specifically, the temperature change results in only a 1.7% change in buckling period.

Uniformity

Figure 5A:
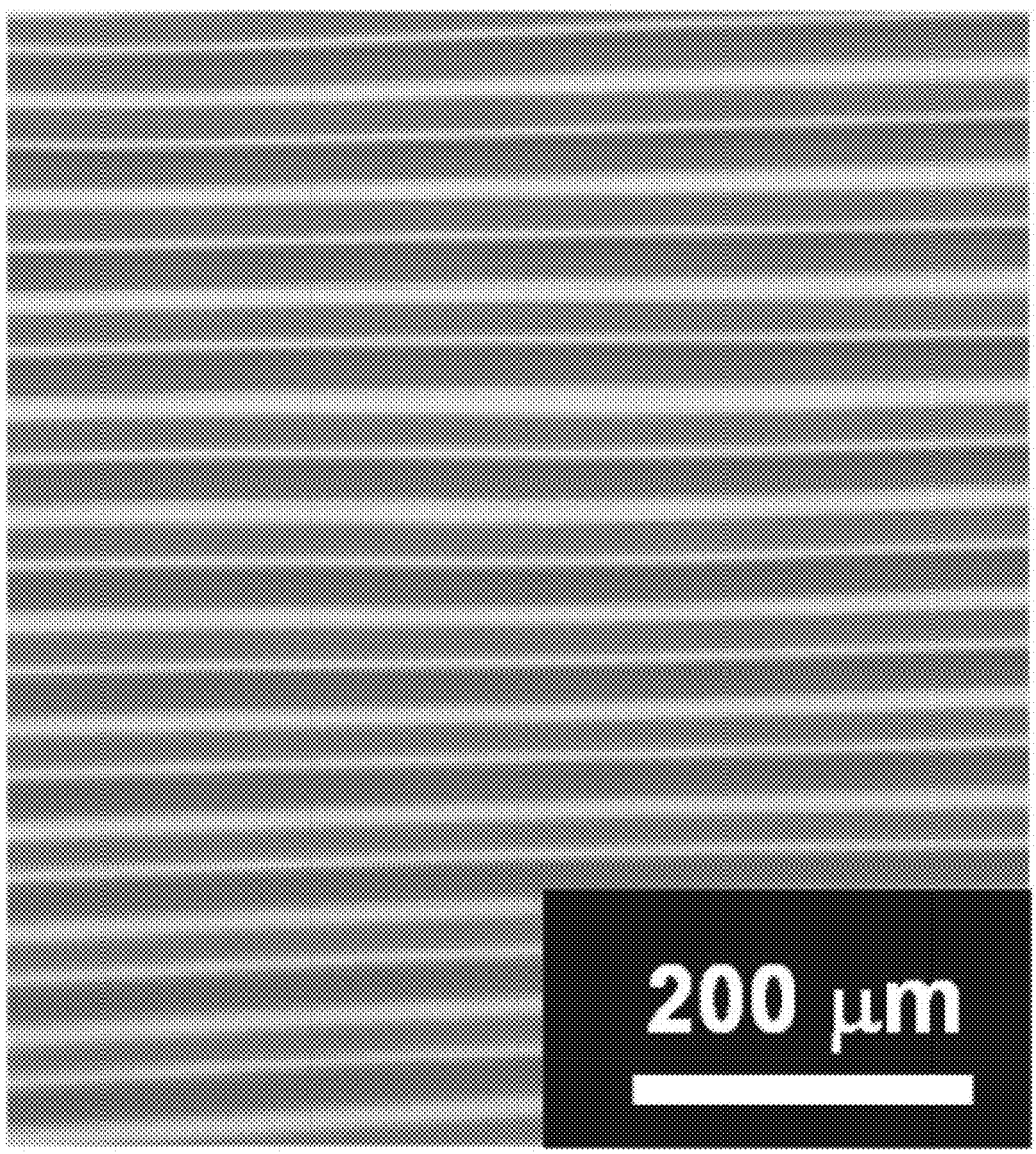
FIG. 5A illustrates a diffraction grating prepared in accordance with various aspects of the present disclosure, wherein no crack can be observed.

In one aspect, a substrate, such as for example, PDMS, can have a uniform and flat surface, which provides a good platform to reach uniformity of the buckled thin film. In one aspect, currently available deposition technologies can produce uniform thin films, for example, down to about 10 nm or less. In one aspect, during the relaxation of the pre-strain to generate buckling, some cracks may be generated along the width direction (i.e., perpendicular to the pre-strain direction) due to the Poisson's effect. Upon relaxation of the pre-strain, the deposited thin film is subjected to compressive strain in the pre-strain direction and tensile strain in the width direction. The compressive strain leads to buckling, resulting in cracks along the width direction. In one aspect, the density of cracks that appear, if any, can be low. In another aspect, the density of cracks can be sufficiently low that cracks are not visible without the aid of a microscope. For example, FIG. 5A illustrates a grating having a very low crack density, wherein no cracks are visible to the naked eye.

The diffraction properties of the optical gratings of the invention can be tested as follows. The schematic experimental setup 200 is shown in FIG. 5B. The light source 210 can come from any suitable lamp, preferably with an output wavelength ranging from 200 nm to 2500 nm. A fiber-coupled spectroradiometer was placed at the angle of =20 degrees to detect the transmitted light. Source light originating from the light source 210 and passing through a slit 220 was aligned normal to the grating sample 230 (the inventive optical grating). The incident light was therefore diffracted by the grating at a range of transmission angles, according to Equation (3) and depending on the amount of stretching, releasing, or compressive force (F) applied to the grating 230. Given an unchanged angle of incidence (=0°) and a fixed angle of diffraction (=20°), Equation (3) can be simplified to constant. As the period of the grating 230, d, is tuned by mechanically stretch or compression (based on Equation 4), the wavelength of the first order of the diffraction light at changes accordingly. The light can be detected using any suitable detector 240.

Measurement of wavelength shift of the transmittance diffraction is performed by fixing the detector 240 and only tuning the applied strain on the grating 230. At zero applied strain, where diffraction grating has the highest amplitude and shortest period, dispersed color from grating order, m, as high as 5 can be clearly observed, with the first order observed with the strongest intensity. With the stretching of the grating 230, bands from these different orders all move simultaneously. The first order of the diffraction light has significant wavelength shift while stretching the grating from 0 to an exemplary maximum of 30% applied strain, defined by the pre-strain of the elastomeric substrate. As the grating is stretched, which induces an increase of the grating period, the wavelength of the diffraction light entering the detector increases.

Figure 6B:
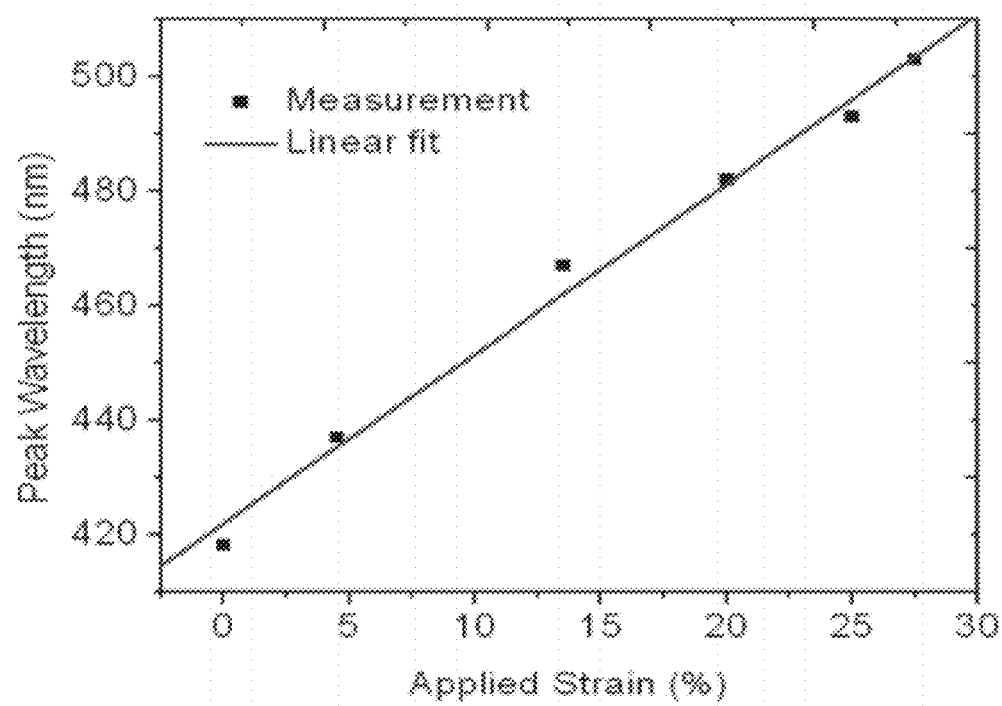
FIG. 6B is a plot of the peak wavelength of the diffraction light versus the applied strain.
Figure 6C:
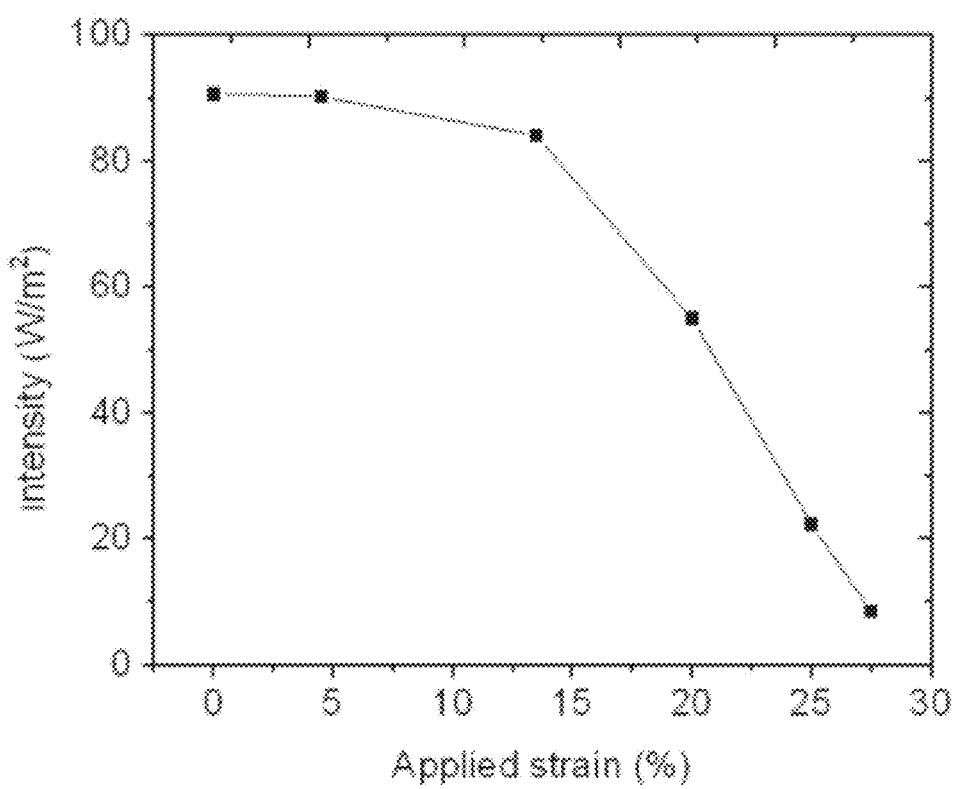
FIG. 6C is a plot of the intensity of light versus the amount of applied strain on the grating.

In an aspect, FIGS. 6A-6C illustrate the diffraction properties of buckled Au/Pd films. As an example, in FIG. 6A, the measured intensities (y-axis) of first order diffraction are graphed against light wavelength (x-axis). Accordingly, the light wavelength shift of about 85 nm is illustrated in the graph (e.g., assuming the detector is fixed). As a further example, in FIG. 6B, the peak wavelength (y-axis) is graphed against the applied strain (x-axis). In FIG. 6C, the intensity (y-axis) is graphed against the applied strain (x-axis). As illustrated in FIGS. 6B-6C, the peak wavelength of the diffraction light increases linearly with the applied strain (%) while the intensity (right y-axis) decreases. In one example, the peak wavelength of first order transmittance diffraction light was initially around 418 nm without any applied strain, and that increases to 503 nm at the applied strain of 27.5%, as shown in FIGS. 6B-6C. It was also observed in this example that as the applied strain increases up to 30%, at which level the Au/Pd film becomes flattened, the ±1st order diffraction coincides with the 0th order. With reference to FIG. 6A, the wavelength tunability is around 85 nm, which is indicated by the color shifting from violet to green, thus demonstrating as a widely tunable optical grating.

In an aspect, the intensity of the transmittance diffraction light entering the detector 240 at different applied strain levels also varies, due to the change in amplitude of the grating 230 with applied strain. As the grating 230 is stretched, the amplitude of the sinusoidal grating also decreases, which contributes to the decrease of the diffraction intensity as plotted in FIG. 6C. The closer the stretching to the exemplary 30% pre-strain level, the faster the amplitude decreases. The amplitude eventually reduces to close to zero intensity at 30% stretching as at this stage the grating amplitude becomes 0.

The diffraction gratings of the invention can be used in a variety of applications, including without limitation telecommunications, color displays, and on-chip biosensing, where a broad spectrum provides additional information, and wherein a traditional reflective grating is hard to implement.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1

In a first example, a transparent PDMS substrate was prepared by casting a mixture of base and curing agent at the ratio of, for example, 10:1 by weight, cured and cut to desired sizes. A 1 mm-thick PDMS strip (10 mm by 40 mm) was subjected to oxygen plasma treatment (50 Watt, 1 min) and then pre-stretched by a custom made stage, at a desired amount of pre-strain. An ultra-thin Au/Pd (95%/5%) film, about 11 nm-thick, was then sputtered onto the pre-stretched PDMS substrate. In one aspect, the relaxation of the pre-strain in the PDMS compresses the Au/Pd thin film and leads to thin films buckle in a periodic shape with buckling period in the micron range. From images of scanning electron microscope (SEM) and atomic force microscope (AFM), the buckling period d and amplitude A are measured as 1.21 mm and 0.19 mm, respectively. These values agree well with the analytical analysis (Eq. 1) if the following material parameters are used, $E_f$=80 GPa, $E_s$=2 MPa, $h_f$=11 nm, $n_f$=0.3, $n_s$=0.49. Therefore, the micron-range buckling period and amplitude can be accurately described by Equation (1).

Example 2

Grating Performance

The periodic pattern of a buckled thin film grating can provide diffraction properties for a grating. The law of diffraction can be expressed by the grating equation:

$$n\sin(\theta_m) - n_i\sin(\theta_i) = \frac{m\lambda}{d}, \quad (4)$$

where $\theta_i$ and $\theta_m$ are the angle0s of incidence and the $m^{th}$ diffraction order, respectively; $n_i$ is the refraction index of the incident medium; n is the refraction index of the medium where the diffracted orders propagate; λ denotes the wavelength of the incident light; and d is the period of the grating. For example, for n=$n_i$=1 as air, $\theta_i$=0, the first order diffraction spectra of visible light whose wavelength ranges from 380 nm to 760 nm would disperse at over an angular range from 22.3° to 49.5° for a grating period of 1 mm;

while the spectra would occupy a smaller range of angles from 2.1° to 4.4° for a grating of 10 mm period, making it difficult to distinguish the spectrum. Thus, to achieve a substantial diffraction over the visible light range, a submicron scale period of the wrinkling shape grating is desired.

In one aspect, the properties of a buckled thin film grating were evaluated using a Xenon arc lamp light source, with output wavelength ranging from 200 nm to 2500 nm. A fiber-coupled spectroradiometer was placed at the angle of $\theta_m=20°$ to detect the transmitted light. The source light passing through a slit was aligned normal to the grating sample. The incident light was therefore diffracted by the grating at a range of transmission angles. Given an unchanged angle of incidence ($\theta_i=0°$) and a fixed angle of diffraction ($\theta_m=20°$), the equation can be simplified to $m\lambda/d$=constant. As the period of the grating d can be tuned by mechanically stretch or compression, the wavelength of the first order diffraction light at $\theta_m$ changes accordingly, as shown in FIGS. 6A-6C.

Figure 7:
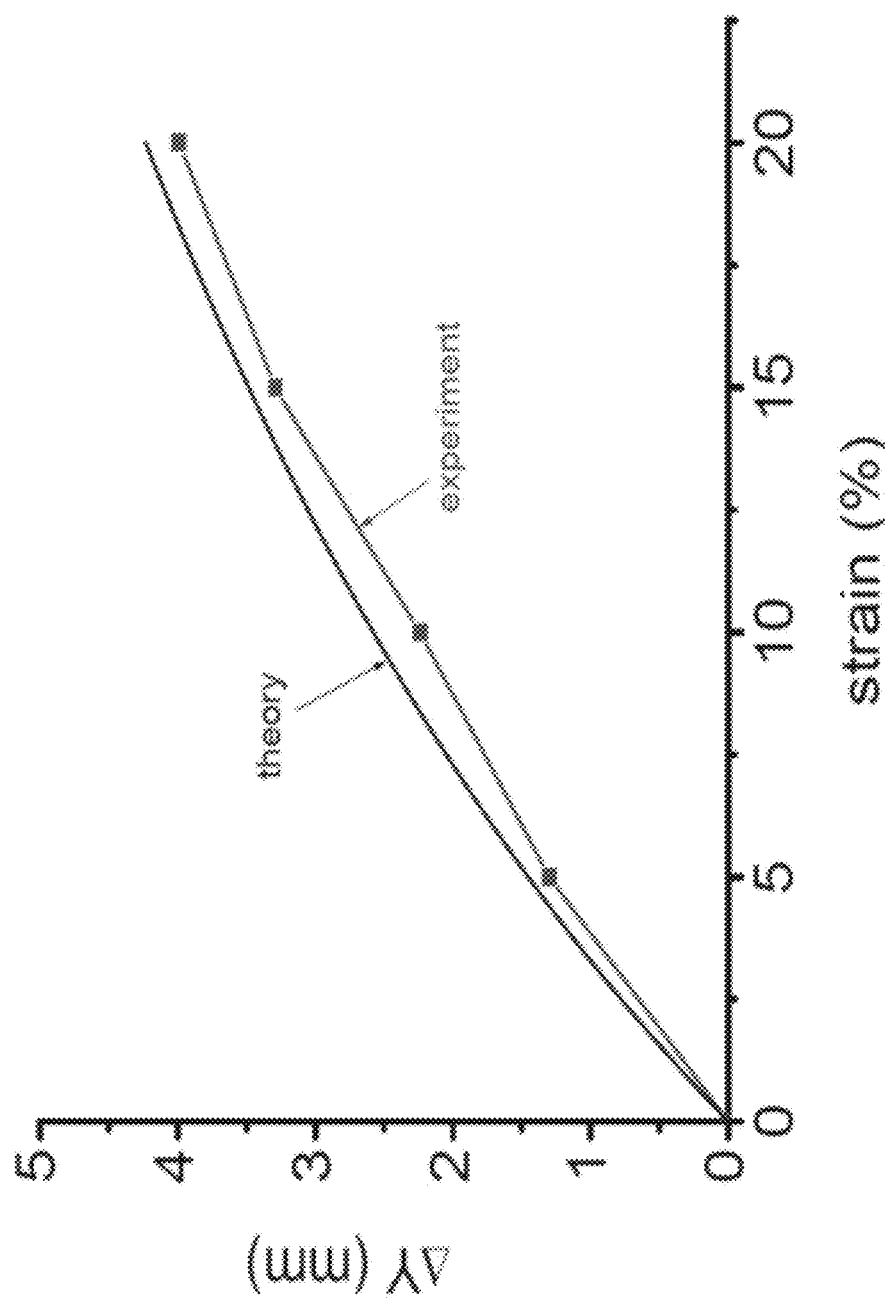
FIG. 7 illustrates experimental vs. theoretical diffracted angles for the peak wavelength of a white light beam on a grating.

The resulting grating can be further evaluated using a laser beam light source, wherein the diffracted laser beam is detected from the transmitted first order beams. As an example, FIG. 7 illustrates a graph of diffracted beam position ($\Delta Y$ in mm) against strain (%). As shown in FIG. 7, the measured diffracted beam position closely follows the predicted position using the standard grating equation.

In one aspect, gratings can remain in the relaxed state, and not in the strained state, in spectrometer applications so as to simplify the structure maintain mechanical stability.

Various modifications and variations can be made to the compounds, composites, kits, articles, devices, compositions, and methods described herein. Other aspects of the the compounds, composites, kits, articles, devices, compositions, and methods described herein will be apparent from consideration of the specification and practice of the compounds, composites, kits, articles, devices, compositions, and methods disclosed herein. It is intended that the specification and examples be considered as exemplary.

What is claimed is:

1. A method for making an optical grating, comprising:
    (a) applying a force to a substrate to strain the substrate; wherein applying a force comprises stretching the substrate;
    (b) disposing a thin metal film on at least a portion of the substrate; and
    (c) reducing the force applied to the substrate, thereby causing the thin film to buckle.

2. The method of claim 1, wherein the substrate comprises an elastomer.

3. The method of claim 1, wherein the substrate comprises polydimethylsiloxane.

4. The method of claim 1, wherein the thin film has a thickness of about 5 to about 500 nm.

5. The method of claim 1, wherein the thin film has a thickness of about 5 to about 200 nm.

6. The method of claim 1, wherein the thin film is disposed on the substrate in a pre-defined pattern.

7. The method of claim 1, wherein the thin film is disposed on the substrate using a sputtering technique.

8. The method of claim 1, wherein reducing the force applied to the substrate comprises substantially removing the force from the substrate.

9. The method of claim 1, wherein the thin film is caused to buckle in a substantially periodic shape.

10. The method of claim 1, wherein the thin film is caused to buckle in a substantially sinusoidal pattern.

11. A method for making an optical grating, comprising:
    (a) providing a strained substrate by applying a force comprising stretching the substrate;
    (b) disposing a thin metal film on at least a portion of the strained substrate; and
    (c) reducing a force applied to the substrate, thereby causing the thin film to buckle.

12. The method of claim 11, wherein the substrate comprises an elastomer.

13. The method of claim 11, wherein the substrate comprises polydimethylsiloxane.

14. The method of claim 11, wherein the thin film has a thickness of about 5 to about 500 nm.

15. The method of claim 11, wherein the thin film is caused to buckle in a substantially periodic shape.

16. The method of claim 11, wherein the thin film is caused to buckle in a substantially sinusoidal pattern.

17. An optical grating comprising:
    an elastomeric substrate; and
    a thin film disposed on at least a portion of the substrate, the thin film comprising a metal and having a periodic shape,
    and wherein operating temperature of the optical grating is in a range from about −45° C. to about 200° C., and wherein the temperature change results in less than 1.7% change in buckling period.

\* \* \* \* \*